US011437987B2

United States Patent
Köllensperger

(10) Patent No.: US 11,437,987 B2
(45) Date of Patent: Sep. 6, 2022

(54) SAFE ELECTRONIC SWITCH

(71) Applicant: Siemens Aktiengesellschaft, Munich (DE)

(72) Inventor: Peter Köllensperger, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/427,504

(22) PCT Filed: Jan. 22, 2020

(86) PCT No.: PCT/EP2020/051514
§ 371 (c)(1),
(2) Date: Jul. 30, 2021

(87) PCT Pub. No.: WO2020/156905
PCT Pub. Date: Aug. 6, 2020

(65) Prior Publication Data
US 2022/0045672 A1 Feb. 10, 2022

(30) Foreign Application Priority Data
Jan. 31, 2019 (EP) .................... 19154819

(51) Int. Cl.
H03K 17/0814 (2006.01)
H02H 3/02 (2006.01)
(52) U.S. Cl.
CPC ....... H03K 17/08148 (2013.01); H02H 3/023 (2013.01); H03K 2217/0009 (2013.01)
(58) Field of Classification Search
CPC ..... H03K 17/08148; H03K 2217/0009; H02H 3/023
See application file for complete search history.

(56) References Cited

U.S. PATENT DOCUMENTS 3,359,434 A * 12/1967 Nicholas ................. G05F 1/573
361/57
4,013,560 A 3/1977 Pradt
(Continued)

FOREIGN PATENT DOCUMENTS

EP 0 550 948 A1 7/1993
EP 1 044 162 B1 12/2004
(Continued)

OTHER PUBLICATIONS

PCT International Search Report and Written Opinion of International Searching Authority dated Apr. 23, 2020 corresponding to PCT International Application No. PCT/EP2020/051514 filed Jan. 22, 2020.

*Primary Examiner* — Scott Bauer
(74) *Attorney, Agent, or Firm* — Henry M. Feiereisen LLC

(57) ABSTRACT

An electronic switch has a first, a second and a third connection and is configured to disconnect a current flow between the first and the second connection. An energy source is connected between the first and the third connection, and a regenerative load is connected between the second and the third connection. The electronic switch includes a semiconductor switch capable of switching currents of different polarity. A fuse is connected between the first connection and the semiconductor switch. A first short-circuiter is connected between the input of the semiconductor switch and the third connection, and a second short-circuiter is connected between the output of the semiconductor switch and the third connection. The fuse has a current trigger threshold between a permanently permitted current and a maximally permitted current of the semiconductor switch. An electrical network having such electronic (Continued)

switch and a method for operating an electronic switch are disclosed.

6 Claims, 3 Drawing Sheets

(56) References Cited

U.S. PATENT DOCUMENTS

| | | | |
|---|---|---|---|
| 4,203,835 | A | 5/1980 | Tagashira et al. |
| 4,234,426 | A | 11/1980 | Wilhelmi et al. |
| 4,626,952 | A | 12/1986 | Morikawa |
| 5,183,577 | A | 2/1993 | Lehmann |
| 6,121,179 | A | 9/2000 | McBrayer, Jr. et al. |
| 11,075,623 | B2 * | 7/2021 | Schierling .......... H03K 17/6874 |
| 2002/0101697 | A1 * | 8/2002 | Chien .................... H02H 9/042 |
| | | | 361/91.1 |
| 2009/0251838 | A1 * | 10/2009 | Rousset ................. H02H 9/041 |
| | | | 361/100 |
| 2009/0262473 | A1 * | 10/2009 | Weinert ................. H02H 9/008 |
| | | | 361/56 |
| 2012/0326680 | A1 | 12/2012 | Brown et al. |
| 2016/0072401 | A1 | 3/2016 | Onishi |
| 2016/0285254 | A1 * | 9/2016 | Ishikawa ................... H02H 7/20 |
| 2018/0145498 | A1 * | 5/2018 | Handy ................... H02H 3/023 |
| 2021/0091561 | A1 * | 3/2021 | Schierling ............... H01B 3/20 |
| 2021/0257827 | A1 * | 8/2021 | Blan ...................... H02H 3/202 |

FOREIGN PATENT DOCUMENTS

| | | |
|---|---|---|
| EP | 3 327 886 A1 | 5/2018 |
| GB | 2 396 982 A | 7/2004 |

* cited by examiner

SAFE ELECTRONIC SWITCH

CROSS-REFERENCES TO RELATED APPLICATIONS

This application is the U.S. National Stage of International Application No. PCT/EP2020/051514, filed Jan. 22, 2020, which designated the United States and has been published as International Publication No. WO 2020/156905 A1 and which claims the priority of European Patent Application, Serial No. 19154819.7, filed Jan. 31, 2019, pursuant to 35 U.S.C. 119(a)-(d).

BACKGROUND OF THE INVENTION

The invention relates to an electronic switch for disconnecting a current flow between a first and a second connection with a semiconductor switch. The invention further relates to an electrical network with at least one electronic switch of this kind and an energy source. The invention further relates to a method for operating an electronic switch of this kind or an electrical network of this kind.

An electronic switch, also referred to as an electronic switching device or a semiconductor-based switching device, is understood as a component that has at least one semiconductor switch and can switch, especially switch off, a current. Transistors such as IGBTs, MOSFETS, IGCTs etc. are examples of a semiconductor switch.

In practice semiconductor-based switching devices are implemented with series-connected conventional fuses, in order, on failure of the semiconductor switch, still to be able to have access to a safe fallback level. The fuse is designed and dimensioned so that it only triggers with a short-circuit current through the semiconductor switch and a failure of the semiconductor switch to switch off. The task of the fuse is to protect the connected load or the connected subnetwork with its lines etc.

A series circuit is understood as the serial arrangement of components, wherein the voltages at the individual components add up. Thus a star circuit has a number of (at least three) series circuits.

The underlying object of the invention is to improve an electronic switch.

SUMMARY OF THE INVENTION

This object is achieved by an electronic switch for disconnecting a current flow between a first and a second connection, having a third connection, a semiconductor switch, a fuse and a short-circuiter, wherein a series circuit of the fuse and the semiconductor switch is arranged between the first connection and the second connection and a series circuit of the fuse and the short-circuiter is arranged between the first connection and the third connection, wherein the fuse has a trigger threshold with a current limit value, wherein the current limit value has a value between a permanently permitted current of the semiconductor switch and a maximum permitted current of the semiconductor switch. This object is further achieved by an electrical network with at least one electronic switch of this kind and an energy source, wherein the energy source is connected to the first connection and the third connection of the electronic switch. This object is further achieved by a method for operating an electronic switch of this kind or an electrical network of this kind wherein, on overloading of the semiconductor switch, the short-circuiter is closed for at least part of the time.

Further advantageous embodiments of the invention are specified in the dependent claims.

The knowledge underlying the invention is that a short-circuit current can be created by the series circuit of fuse and short-circuiter, which leads to the fuse triggering and thus protects the semiconductor switch and a load connected to the electronic switch or a number of loads connected there from overload. In this case an energy source, for example an energy-providing DC bus, can be connected to the first and third connection of the electronic switch and the loads or a subnetwork with different loads is connected to the second and third connection. The triggering of a fuse is also referred to as a tripping of the fuse.

If the semiconductor switch is threatened with an overload, the semiconductor switch is reduced to zero current as quickly as possible. This is achieved by the short-circuiter being put into the conductive state and driving a short-circuit current via the fuse from the connected energy source. As a consequence the fuse triggers and the semiconductor switch is at zero current. In this way the transmission of electrical energy to the loads connected to the electronic switch is also interrupted and these loads are protected from overloading. Instead of a number of loads, just one load, a consumer or a subnetwork can also be connected to the electronic switch.

Among other things, the danger in an overloading of the semiconductor switch lies in the fact that it can no longer open or sustains damage when opening. Through the triggering of the fuse this danger, i.e. both of a switching failure and also of damage during the switching-off process, can be avoided, since the current is switched off by the fuse. After resetting or replacing the fuse the electronic switch is ready for use again. Furthermore, the fuse likewise protects the loads and lines connected thereto from overloading.

An overload or the threat of an overload can be detected with the aid of a criterion. For example the overload can be determined on the basis of a current value through the semiconductor switch or by evaluating the current value. In this case it is also possible for example to recognize the overload or the threat of an overload on the basis of a temperature, in particular the junction temperature, of the semiconductor of the semiconductor switch. The current value can also be employed for determining the temperature, in particular on the basis of a temperature model.

By way of the method described, the semiconductor switch is reliably protected from being destroyed or damaged, so that after replacement or resetting of the fuse and possibly after rectification of the error causing the overload, further operation is possible without replacing the expensive semiconductor.

There are thus many ways in which damage to or destruction of the semiconductor switch can be avoided, by which cost savings can essentially be realized. Moreover a second triggering option also exists for the fuse, so that redundancy exists for the semiconductor switch, which ensures that it is switched off safely.

A further advantage of the electronic switch lies in the function of the electronic switch, even in the event of a malfunction in the semiconductor switch, being able to realize a safe opening of the electronic switch. Then, by closing the short-circuiter and the subsequent triggering, i.e. opening of the fuse, the consumer, the load or a connected subnetwork, which is connected to the second connection of the electronic switch, can be disconnected from the energy source, which is connected to the first connection.

If the switch in the short-circuiter can block a voltage with different polarity and can conduct a current with different polarity, which can be realized in a simple way by using two semiconductors that are connected in an antiserial or antiparallel circuit, then the switch can be used both for AC voltage applications as an AC voltage switch or also for DC voltage applications with both polarities as a DC voltage switch.

The electronic switch is thus able to be used as an AC voltage switch and also as a DC voltage switch for different polarities provided the short-circuiter can block a voltage with different polarity and conduct a current with different polarity.

It has proved especially advantageous for the fuse to have a trigger threshold with a current value that lies between a permanently permitted current value for the semiconductor switch and a maximum permitted value for the semiconductor switch. Such a trigger value enables the fuse to carry out a number of safety functions safely and independently of one another. On the one hand an impermissibly high current is already avoided solely by the fuse, since such a current would lead to the fuse being triggered. Furthermore, the semiconductor switch with this arrangement can simultaneously be briefly overloaded, since the trigger threshold is set suitably high, i.e. above the permanently permitted current value of the semiconductor. The loading of the semiconductor can be monitored in this case by means of a closed-loop/open-loop control or protection apparatus. If the monitoring is triggered the semiconductor switch can be opened. Only on overload, in which the semiconductor switch can sustain damage by opening it, does the short-circuiter come into use. This drives through the fuse such a high current, which lies above the maximum permitted current value of the semiconductor switch, and thus causes the fuse to be triggered.

The particular advantage of this trigger threshold thus lies in the synergetic collaboration between the protection function of the fuse against overcurrent and the regulation, which controls the short-circuiter and thus can intervene in a protective manner via the fuse.

In this case the energy source of the electrical network, in particular in respect of its short-circuit performance, should be powerful enough to be able to create a current greater than the maximum permitted current of the semiconductor switch.

In an advantageous embodiment of the invention a further short-circuiter is arranged between the second connection and the third connection. If the load is capable of feedback or has an energy store, this can also result in a current from the load or the number of loads in the direction of the electronic switch. Then, through the conducting short-circuiter a current arises from the load or the loads via the semiconductor switch through the short-circuiter. The further short-circuiter serves to exclude a current flow that comes from the load side through the semiconductor switch. In this case the further short-circuiter is closed at least temporarily when the short-circuiter will be closed or is closed, The closing of the further short-circuiter can thus occur at the same time with a time delay from the closing of the short-circuiter, in order safely to be able to exclude a current flow from the energy source through the semiconductor switch and the further short-circuiter.

Thus it has proved advantageous, for the protection of the semiconductor switch, to close the further short-circuiter, provided the connected load permits such a short-circuit, in order to avoid, or even exclude completely, a current flow through the semiconductor switch.

In a further advantageous embodiment of the invention the short-circuiter is embodied as a thyristor. Thyristors are available at low cost on the market and at the same time have a very-high short-term overload capability. This is important to enable a high short-circuit current to be briefly conducted, without damaging the short-circuiter, in this case the thyristor. The disadvantage of a thyristor, that it cannot switch off a current, is not a factor, since the switching-off is done by the fuse and thus the current through the thyristor comes to a halt after a brief period.

If the short-circuiter is formed as a switch by pairs of anti-parallel connected thyristors, then such a switch can be used as an AC voltage switch and/or as a DC voltage switch with both polarities.

As well as thyristors, other switchable semiconductor elements can be used, provided these can bear the high short-circuit current and, in doing so, can keep the voltage via themselves sufficiently small.

In a further advantageous embodiment of the invention a further fuse is arranged between the semiconductor switch and the second connection in such a way that a series circuit of the further short-circuiter and the further fuse is arranged between the second connection and the third connection. Such an embodiment allows two subnetworks to be connected to one another. With an overload of the switch the short-circuiter and the further short-circuiter can be dosed simultaneously, so that the fuse and the further fuse are triggered and the exchange of energy between the two subnetworks is interrupted. The semiconductor switch, with the simultaneous closing of the short-circuiter and the further short-circuiter, is not subjected to any short-circuit current and is thus not subject to any further load, but is quickly put into a voltage-free and current-free state.

Furthermore, the electronic switch in this version is symmetrically constructed, so that it is versatile and suitable for all applications, in particular for any given combinations of subnetworks and electrical consumers and does not require any specific adaptation. Moreover the two fuses mean that redundancy is available, which makes the electronic switch especially safe.

In a further advantageous embodiment of the invention the further short-circuiter is dosed when the short-circuiter is dosed and a current through the semiconductor switch exceeds a predeterminable limit value or when the amount of the current through semiconductor switch exceeds the predeterminable limit value. Since the closing of the further short-circuiter could readily represent a load on the connected loads, it has proved useful to only dose said short-circuiter when a load for the semiconductor switch would actually be produced by a feedback of the load. In this case the triggering is advantageously made dependent on a current through the semiconductor switch. if this measured current value or the amount of the measured current value or the effective value of the measured current value exceeds a predeterminable limit value, then the further short-circuiter will be closed provided the short-circuiter has already been closed.

BRIEF DESCRIPTION OF THE DRAWING

The invention will be described and explained below in greater detail with the aid of the exemplary embodiments shown in the figures. In the figures.

DETAILED DESCRIPTION OF PREFERRED EMBODIMENTS

Figure 1:
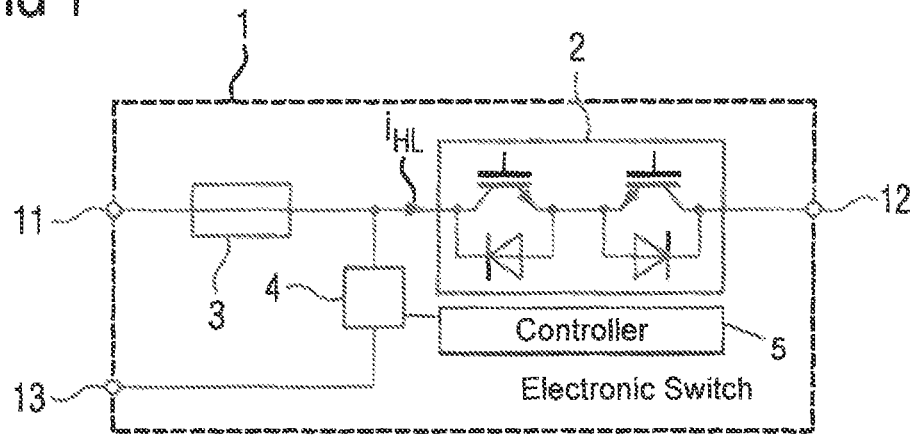
FIG. 1 and FIG. 2 show exemplary embodiments of an electronic switch.

FIG. 1 shows an electronic switch 1. The electronic switch 1 has a first connection 11, a second connection 12 and a third connection 13. A series circuit of a fuse 3 and a semiconductor switch 2 is arranged between the first connection 11 and the second connection 12. The semiconductor switch 2 has two semiconductors, which can each switch off a current of different polarity. Thus the electronic switch 1 is capable of switching a current iHL through the semiconductor switch 2 independently of its polarity, in particular to switch it off. A series circuit of the fuse 3 and a short-circuiter 4 is arranged between the first connection 11 and the third connection 13. In this case the components fuse 3, semiconductor switch 2 and short-circuiter 4 form a star circuit. In this star circuit these three components are connected to one another in a star point and furthermore are each connected to a connection of the electronic switch 1. The first connection 11 and the third connection 13 are provided for the connection with an energy source 7 not shown here or with an energy-supplying DC bus. The second connection 12, or the voltage between the second connection 12 and third connection 13 is intended for connection to a load or a consumer. It is likewise possible to connect these connections to a subnetwork, which has a plurality of loads or electrical consumers. A controller 5 controls the short-circuiter 4, as well as the short-circuiter 41 (FIG. 2) not shown, for example embodied as a thyristor or another switchable semiconductor elements capable of conducting the high short-circuit current.

Figure 2:
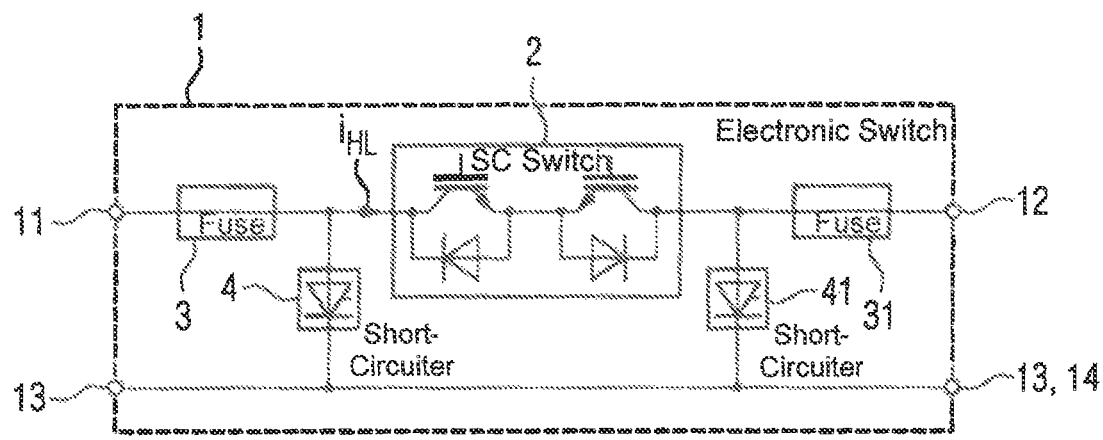

FIG. 2 shows a further exemplary embodiment of an electronic switch 1 To avoid repetitions the reader is referred to the description for FIG. 1 as well as to the reference numbers quoted there. This electronic switch 1 has a further short-circuiter 41, which is arranged between the second connection 12 and the third connection 13 of the electronic switch 1. Thus the further short-circuiter 41 is arranged in parallel to a series circuit consisting of semiconductor switch 2 and short-circuiter 4. For simple connection to a source, in particular to an energy source 7 not shown here, and a load, the electronic switch 1 possesses the source-side connections, i.e. the first connection 11 and the third connection 13 and the load-side connections, i.e. the second connection 12 and a further connection 14. Since the further connection 14 is permanently coupled to the potential of the third connection 13, this further connection 14 can also be referred to as the third connection 13. Likewise a further connection 14 for connection to a consumer or a load can also be present outside the electronic switch. A conducting connection to the third connection 13 merely has to be provided.

Furthermore this electronic switch optionally has a further fuse 31 between the semiconductor switch 2 and the second connection 12. With this fuse both the first connection 11 and also the second connection 12 can be safely electrically disconnected from the semiconductor switch 2, in that, in the event of an overload of the semiconductor switch, the short-circuiter 4 and also the further short-circuiter 41 are simultaneously closed.

The short-circuiter 4 and the further short-circuiter 41 are each shown in this exemplary embodiment as a thyristor. If it can be assumed that the potential of the first or second connection 11, 12 is always greater than or equal to the potential of the third terminal 13, a single thyristor is sufficient. If on the other hand the third connection can also assume a higher potential than the first connection 11 or the second connection 12, then advantageously two thyristors are used in each case, which are arranged antiparallel to one another, FIG. 3 shows such an arrangement.

Figure 3:
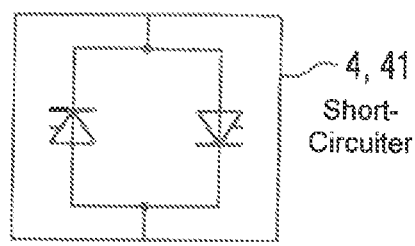
FIG. 3 shows an exemplary embodiment of a short-circuiter.

An electronic switch 1 with a short-circuiter 4 and/or a further short-circuiter 41 in accordance with FIG. 3 makes it possible to use it in DC networks, in which the polarity of the DC voltage can change, and to use it in AC networks.

Figure 4:
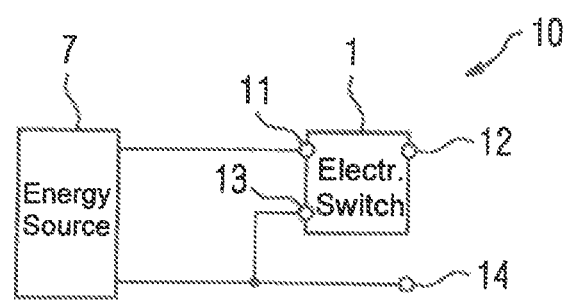
FIG. 4 shows an electrical network.

FIG. 4 shows an electrical network 10 with an energy source 7 and an electronic switch 1. The electronic switch 1 In this case has the previously described connections 11, 12, 13. The further connection 14 is arranged outside the electronic switch 1 in this case and is connected to the third connection 13 of the electronic switch 1. The second connection 12 and the further connection 14 form the load-side connections for connection to one or more consumers or loads or to a subnetwork.

Figure 5:
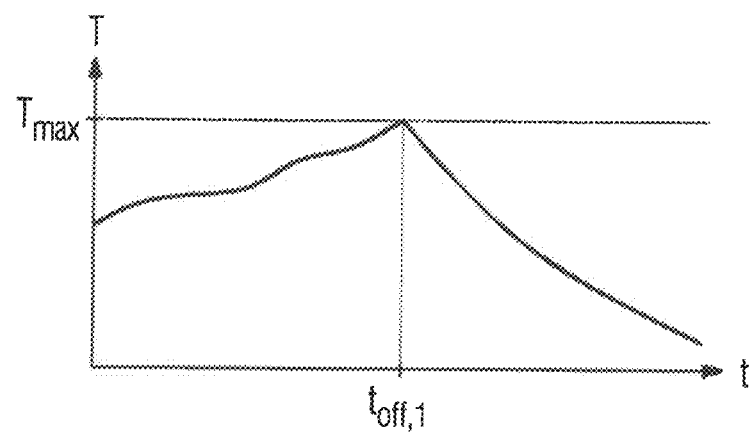
FIG. 5 and FIG. 6 shows time curves of variables of the semiconductor switch

FIG. 5 shows the timing curve of the temperature T of the semiconductor switch 2. This temperature can involve the junction temperature of the semiconductor for example, which is determined by means of a computer model from measured values such as for example a temperature value and/or a current. With the aid of the temperature, in particular the junction temperature, a criterion can be formed, with which an overload or the threat of an overload of the semiconductor switch 2 can be recognized.

In this example the temperature T fluctuates, for example as a function of the operating state and/or the load on the semiconductor switch 2. If the temperature T reaches a predeterminable limit value $T_{Max}$, as at point in time $t_{off,1}$, then the short-circuiter 4 closes in order to create a short-circuit current through the fuse 3 and cause the fuse 3 to trigger. When it triggers, the fuse 3 goes into the disconnection state After the triggering of the fuse 3 the temperature T falls as a result of the load, caused by the current flow, no longer being present.

Figure 6:
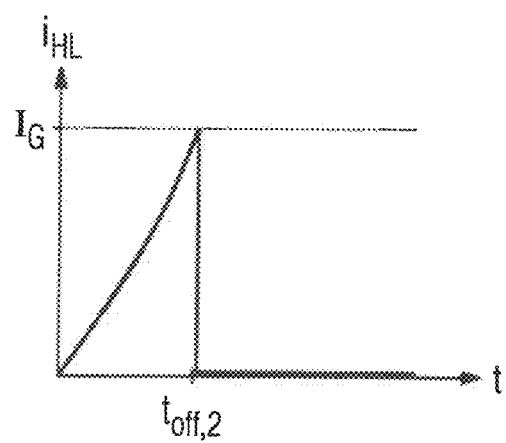

FIG. 6 shows the timing curve of the amount of current $i_{HL}$ through the semiconductor switch 2. The triggering of the short-circuiter 4 also enables a recovery current of the load to flow through the semiconductor switch 2 and short-circuiter 4. Because of the short circuit the amount of this current $i_{HL}$ increases rapidly. When the limit value $I_G$ is reached, at point in time $t_{off,2}$, the further short-circuiter 41 closes and the recovery current no longer flows through the semiconductor switch 2 but flows through the further short-circuiter 41.

In summary the invention relates to an electronic switch, having a first, a second and a third connection, a semiconductor switch, a fuse, a short-circuiter, wherein a series circuit of the fuse and the semiconductor switch is arranged between the first connection and the second connection and a series circuit of the fuse and the short-circuiter is arranged between the first connection and the third connection. In other words the invention relates to an electronic switch for disconnecting a current flow between a first and a second connection, having a third connection, a semiconductor switch, a fuse, a short-circuiter, wherein a series circuit of the fuse and the semiconductor switch is arranged between the first connection and the second connection and a series circuit of the fuse and the short-circuiter is arranged between the first connection and the third connection, wherein the fuse has a trigger threshold with a current limit value, wherein the current limit value has a value between a permanently permitted current of the semiconductor switch and a maximum permitted current of the semiconductor switch. The invention further relates to an electrical network with at least one such electronic switch and an energy source, wherein the energy source is connected to the first connection and the third connection of the electronic switch. The invention further relates to a method for operating such an electronic switch or such an electrical network wherein, when the semiconductor switch is overloaded, the short-circuiter is closed at least temporarily.

The invention claimed is:

1. An electrical network, comprising:
   an energy source and a regenerative load,
   an electronic switch having a first connection, a second connection and a third connection, with the energy source connected to the first connection and the third connection and the load connected to the second connection and the third connection, wherein the electronic switch is configured to disconnect a current flow between the first connection and the second connection,
   a semiconductor switch comprising two semiconductors, which can each switch off a current of different polarity,
   a first fuse connected between the first connection and an input of the semiconductor switch and having a trigger threshold with a current limit value,
   a first controllable short-circuiter connected between the input of the semiconductor switch and the third connection, and
   a second controllable short-circuiter connected between the output of the semiconductor switch and the third connection, wherein
   the first short-circuiter is controlled so as to at least temporarily close the first short-circuiter when the semiconductor switch is overloaded,
   the second short-circuiter is controlled so as to at least temporarily close the second short-circuiter when the first short-circuiter being closed or is closed, and
   the first fuse is triggered when a current through the first fuse exceeds the current limit value as a result of at least the first short-circuiter being closed.

2. The electrical network of claim 1, wherein at least one of the first and second short-circuiters is embodied as a thyristor.

3. The electrical network of claim 1, further comprising a second fuse connected between the output of the semiconductor switch and the second connection.

4. A method for operating an electronic switch of an electrical network, wherein the electronic switch has a first connection, a second connection and a third connection, with an energy source connected to the first connection and the third connection and a load connected to the second connection and the third connection, wherein the electronic switch is configured to disconnect a current flow between the first connection and the second connection, the electronic switch comprising a semiconductor switch comprising two semiconductors, which can each switch off a current of different polarity, a first fuse connected between the first connection and an input of the semiconductor switch, a first short-circuiter connected between the input of the semiconductor switch and the third connection, and a second short-circuiter connected between the output of the semiconductor switch and the third connection, the method comprising
   controlling the first short-circuiter so as to at least temporarily close the first short-circuiter when the semiconductor switch is overloaded,
   controlling the second short-circuiter so as to at least temporarily close the second short-circuiter when the first short-circuiter is being closed or is closed, and
   triggering a first fuse connected between the first connection and an input of the semiconductor switch when a current through the first fuse exceeds a current limit value of, the fuse as a result of at least the first short-circuiter being closed.

5. The method of claim 4, further comprising closing the second short-circuiter when the first short-circuiter is closed and a current or a magnitude of the current through the semiconductor switch exceeds a predetermined limit value.

6. The method of claim 4, wherein the second short-circuiter is closed concurrently with the first short-circuiter.

* * * * *